(12) United States Patent
Kim et al.

(10) Patent No.: US 10,217,902 B2
(45) Date of Patent: Feb. 26, 2019

(54) LIGHT EMITTING DEVICE AND LIGHTING APPARATUS INCLUDING THE SAME

(71) Applicant: LG INNOTEK CO., LTD., Seoul (KR)

(72) Inventors: Sung Kyoon Kim, Seoul (KR); Min Gyu Na, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 22 days.

(21) Appl. No.: 15/555,428

(22) PCT Filed: Feb. 26, 2016

(86) PCT No.: PCT/KR2016/001923
§ 371 (c)(1),
(2) Date: Sep. 1, 2017

(87) PCT Pub. No.: WO2016/144026
PCT Pub. Date: Sep. 15, 2016

(65) Prior Publication Data
US 2018/0040771 A1    Feb. 8, 2018

(30) Foreign Application Priority Data
Mar. 6, 2015  (KR) .................. 10-2015-0031337

(51) Int. Cl.
*H01L 33/36* (2010.01)
*H01L 33/50* (2010.01)
(Continued)

(52) U.S. Cl.
CPC .............. *H01L 33/36* (2013.01); *H01L 24/05* (2013.01); *H01L 25/0753* (2013.01);
(Continued)

(58) Field of Classification Search
USPC .......................................................... 257/88
See application file for complete search history.

(56) References Cited

U.S. PATENT DOCUMENTS

2002/0139987 A1   10/2002  Collins, III et al.
2008/0017871 A1    1/2008  Lee et al.
(Continued)

FOREIGN PATENT DOCUMENTS

JP         2009-260311 A     11/2009
KR    10-2011-0098874 A       9/2011
(Continued)

*Primary Examiner* — Moazzam Hossain
*Assistant Examiner* — Lawrence C Tynes, Jr.
(74) *Attorney, Agent, or Firm* — Birch, Stewart, Kolasch & Birch, LLP

(57) ABSTRACT

A light-emitting device includes a substrate, first and second electrode pads, first to M-th light-emitting cells arranged in a line in a first direction between the first and second electrode pads, and first to N-th connection wires for electrically connecting the first to M-th light-emitting cells, wherein each of the first to M-th light-emitting cells comprises a first conductive semiconductor layer, an active layer, and a second conductive semiconductor layer, wherein the first electrode pad is connected to the second conductive semiconductor layer of the first light-emitting cell while the second electrode pad is connected to the first conductive semiconductor layer of the M-th light-emitting cell, and an n-th connection wire electrically connects the first conductive semiconductor layer of an n-th light-emitting cell to the second conductive semiconductor layer of an (n+1)-th light-emitting cell, which are adjacent to each other.

19 Claims, 5 Drawing Sheets

(51) Int. Cl.
  *H01L 33/62* (2010.01)
  *H01L 23/00* (2006.01)
  *H01L 33/08* (2010.01)
  *H01L 25/075* (2006.01)
  *H01L 33/38* (2010.01)

(52) U.S. Cl.
  CPC ............ *H01L 33/08* (2013.01); *H01L 33/505* (2013.01); *H01L 33/507* (2013.01); *H01L 33/62* (2013.01); *H01L 33/385* (2013.01); *H01L 2224/48091* (2013.01); *H01L 2924/12041* (2013.01)

(56) References Cited

U.S. PATENT DOCUMENTS

| | | | |
|---|---|---|---|
| 2009/0242910 A1 | 10/2009 | Murofushi et al. | |
| 2010/0032692 A1 | 2/2010 | Lee et al. | |
| 2010/0117101 A1 | 5/2010 | Kim et al. | |
| 2011/0210352 A1* | 9/2011 | Lee | H01L 27/156 257/93 |
| 2012/0008204 A1* | 1/2012 | Kobayashi | G02B 27/2285 359/475 |
| 2013/0306997 A1* | 11/2013 | Lim | H01L 27/156 257/88 |
| 2015/0132873 A1* | 5/2015 | Rogers | H01L 25/0753 438/27 |

FOREIGN PATENT DOCUMENTS

| | | |
|---|---|---|
| KR | 10-2011-0099673 A | 9/2011 |
| KR | 10-2013-0058303 S | 6/2013 |

* cited by examiner

[FIG. 1]
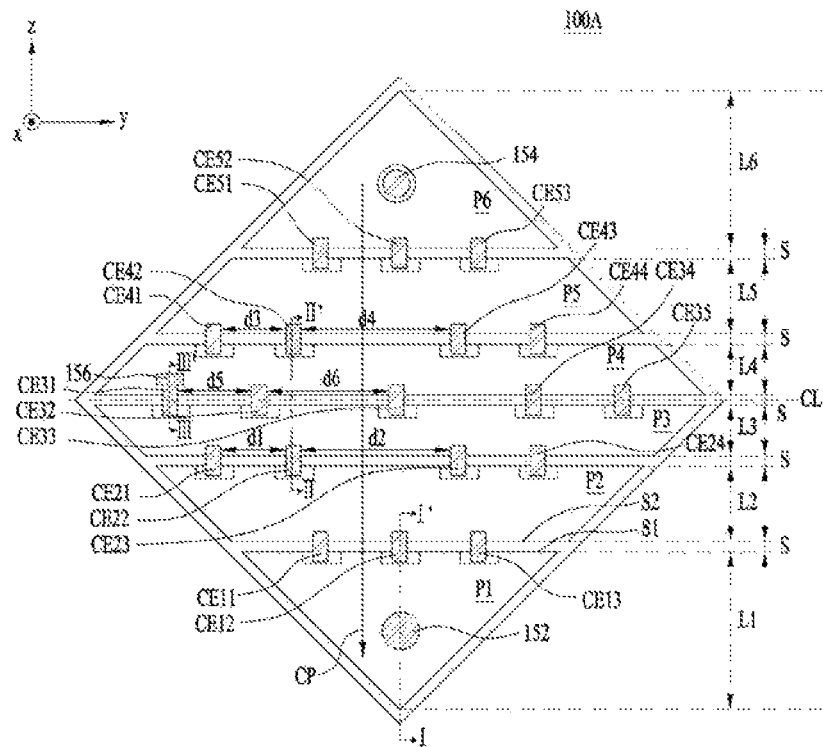
[FIG. 2]
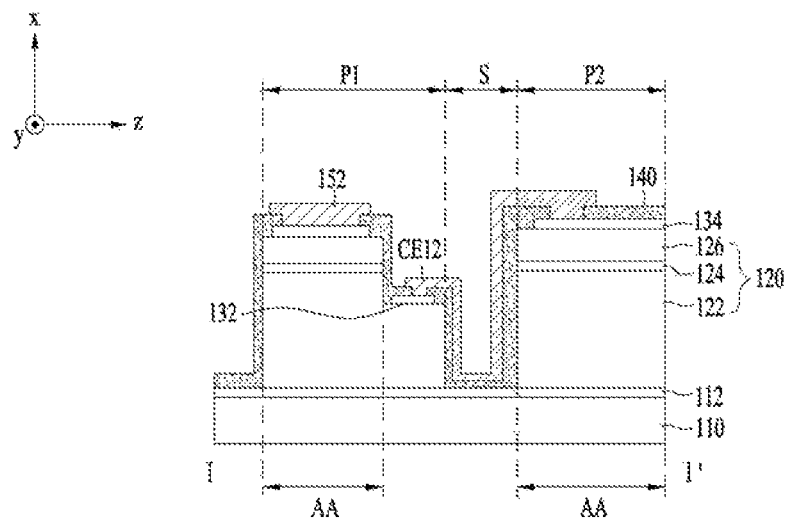

[FIG. 3]
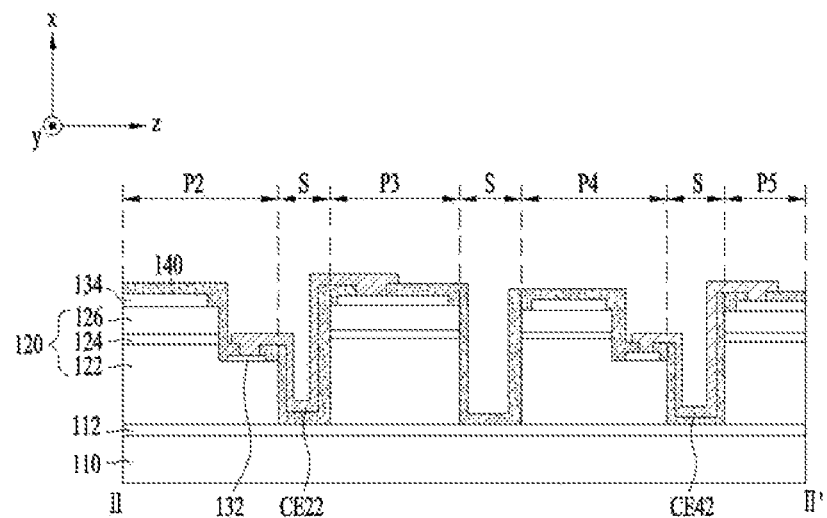
[FIG. 4]
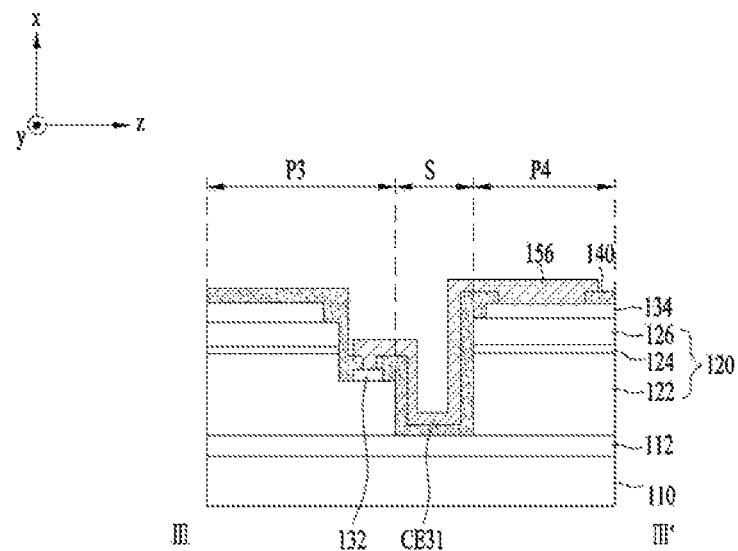
[FIG. 5]
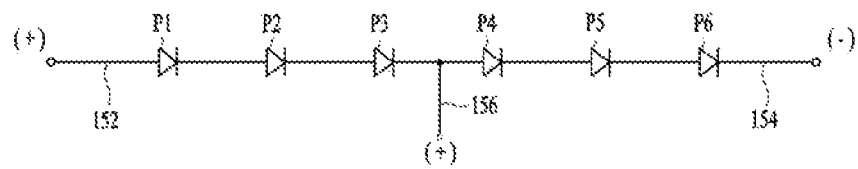

[FIG. 6]
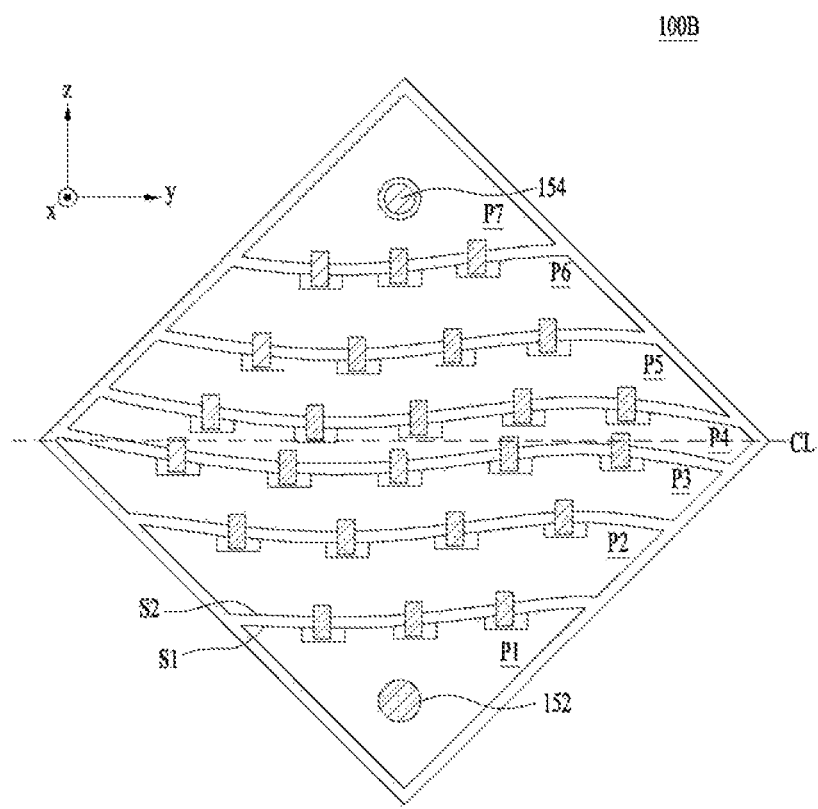

[FIG. 7]
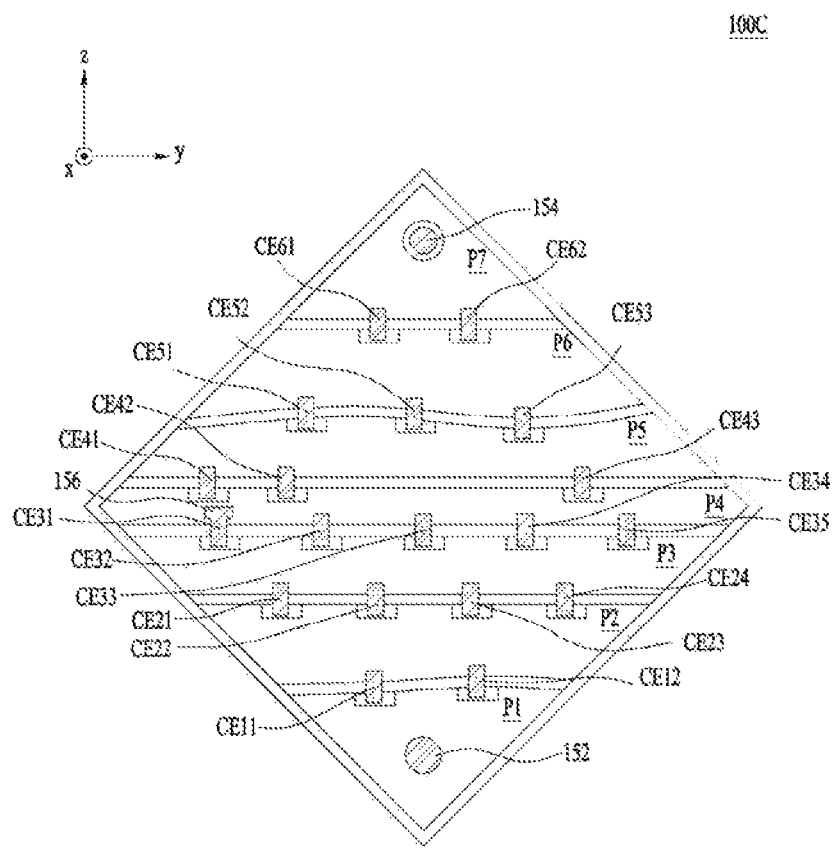

[FIG. 8]
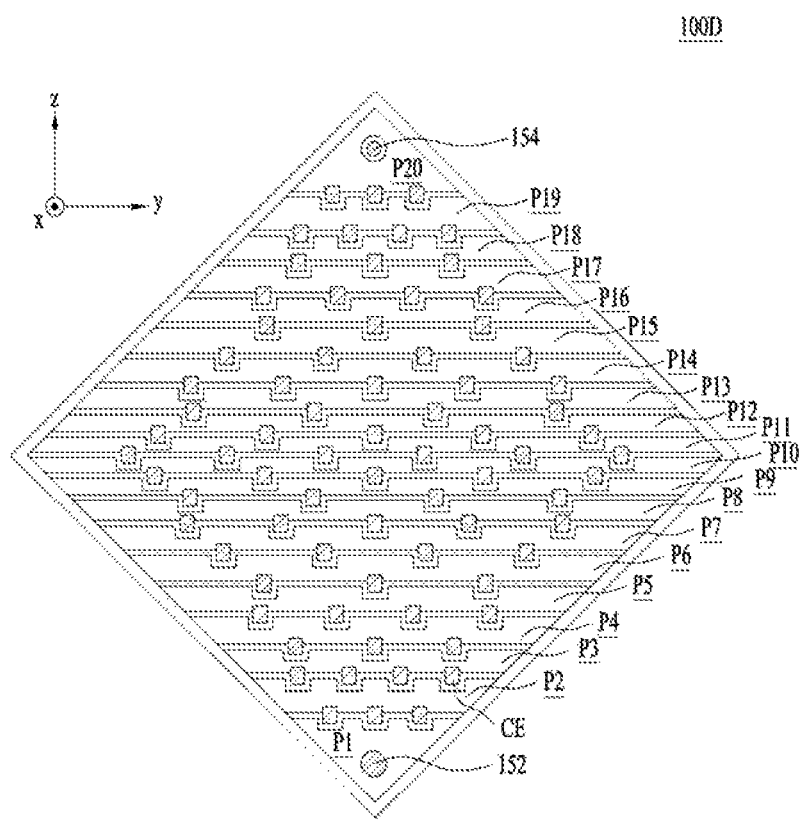

LIGHT EMITTING DEVICE AND LIGHTING APPARATUS INCLUDING THE SAME

CROSS REFERENCE TO RELATED APPLICATIONS

This application is the National Phase of PCT International Application No. PCT/KR2016/001923, filed on Feb. 26, 2016, which claims priority under 35 U.S.C. 119(a) to Patent Application No. 10-2015-0031337, filed in the Republic of Korea on Mar. 6, 2015, all of which are hereby expressly incorporated by reference into the present application.

TECHNICAL FIELD

Embodiments relate to a light-emitting device and a lighting apparatus including the same.

BACKGROUND ART

With the advancement of metal organic chemical vapor deposition method and molecular beam epitaxy method using gallium nitride (GaN), red, green, and blue light-emitting diodes (LEDs) capable of realizing high-luminance white light have been developed.

LEDs do not contain environmentally hazardous substances, such as mercury (Hg), which are used in conventional lighting apparatuses, such as incandescent lamps or fluorescent lamps. Consequently, LEDs are environmentally friendly. In addition, LEDs exhibit long life spans and low power consumption. As a result, LEDs have replaced conventional light sources. A core competitive factor of LEDs is the realization of high luminance based on a high-efficiency, high-output chip and packaging technology.

In order to realize high luminance, it is important to increase optical extraction efficiency. In order to increase optical extraction efficiency, various methods have been studied using a flip-chip structure, surface texturing, a patterned sapphire substrate (PSS), photonic crystal technology, and an anti-reflection layer structure.

One conventional light-emitting device is disclosed in U.S. Pat. No. 7,646,031 (2010 Jan. 12, title of the invention: LIGHT EMITTING DEVICE HAVING LIGHT EMITTING ELEMENTS). In the disclosed light-emitting device, LEDs 1 are arranged in a zigzag fashion, rather than in a line, between electrode pads 32. As a result, freedom of design may be limited, and current may be locally crowded in the center of the light-emitting device. Furthermore, adjacent LEDs 1 are connected to each other via a single air bridge line 28. If the line 28 is disconnected, the entire light-emitting device becomes inoperable, with the result that the reliability of the light-emitting device is reduced.

DISCLOSURE

Technical Problem

Embodiments provide a light-emitting device having improved reliability and a lighting apparatus including the same.

Technical Solution

In one embodiment, a light-emitting device may include: a substrate; first and second electrode pads; first to M-th light-emitting cells disposed on the substrate and arranged in a line in a first direction between the first and second electrode pads (M being a positive integer that is equal to or greater than 2); and first to N-th connection wires for electrically connecting the first to M-th light-emitting cells (N being a positive integer satisfying $1 \le N \le M-1$), wherein each of the first to M-th light-emitting cells may include a first conductive semiconductor layer, an active layer, and a second conductive semiconductor layer, which are sequentially disposed on the substrate, the first electrode pad may be connected to the second conductive semiconductor layer of the first light-emitting cell while the second electrode pad may be connected to the first conductive semiconductor layer of the M-th light-emitting cell, and an n-th (n being a positive integer satisfying $1 \le n \le N$) connection wire may electrically connect the first conductive semiconductor layer of an n-th light-emitting cell to the second conductive semiconductor layer of an (n+1)-th light-emitting cell, which are adjacent to each other.

For example, the n-th connection wire may include a plurality of connection metal layers disposed so as to be electrically isolated from each other in a second direction, which is different from the first direction.

For example, the light-emitting device may further include an intermediate pad connected to the first light-emitting cell and to the first or second conductive semiconductor layer of an arbitrary light-emitting cell disposed between the first light-emitting cell and the M-th light-emitting cell.

For example, the connection metal layers included in one selected from among the first to N-th connection wires and the connection metal layers of another selected from among the first to N-th connection wires may be disposed so as to be staggered from each other in the first direction.

For example, the connection metal layers of a k-th (k being a positive integer satisfying $1 \le k \le N-1$) connection wire and the connection metal layers included in a (k+1)-th connection wire may be disposed so as to be staggered from each other in the first direction.

For example, the distance between the connection metal layers of each of the first to N-th connection wires may gradually decrease as approaching the edge of the light-emitting device.

For example, the distance between the connection metal layers in each of the first to N-th connection wires may gradually increase as approaching a center line crossing between the first light-emitting cell and the M-th light-emitting cell.

For example, the length of each of the first to M-th light-emitting cells in the first direction may gradually decrease as approaching the center line crossing between the first light-emitting cell and the M-th light-emitting cell and gradually increase as being far away from the center line.

For example, the number of connection metal layers included in each of the first to N-th connection wires may gradually increase as approaching the center line crossing between the first light-emitting cell and the M-th light-emitting cell.

For example, the planar area deviation of active regions of the first light-emitting cell and the M-th light-emitting cell may be within 20%.

For example, the planar shapes of the active regions of the first to M-th light-emitting cells may be symmetric with respect to the center line crossing between the first light-emitting cell and the M-th light-emitting cell.

In another embodiment, a light-emitting device may include: a substrate; first and second electrode pads; first to M-th (M being a positive integer that is equal to or greater than 2) light-emitting cells disposed on the substrate and arranged in a line in a first direction between the first and second electrode pads; and first to N-th (N being a positive integer satisfying 1≤N≤M−1) connection wires for electrically connecting the first to M-th light-emitting cells, wherein adjacent ones of the first to M-th light-emitting cells may be disposed so as to be spaced apart from each other by a boundary region formed on the substrate, and opposing surfaces of adjacent ones of the first to M-th light-emitting cells may be curved in a plane view.

For example, each of the connection wires may include a plurality of connection metal layers disposed so as to be electrically isolated from each other in a second direction, which is different from the first direction.

For example, the planar shapes of active regions of the first to M-th light-emitting cells may be asymmetric with respect to a center line crossing between the first light-emitting cell and the M-th light-emitting cell.

For example, the numbers of connection metal layers included in the first to N-th connection wires may be symmetric with respect to the center line crossing between the first light-emitting cell and the M-th light-emitting cell.

For example, the substrate may have a polygonal planar shape, and the first direction may be a diagonal direction of the polygon.

For example, the numbers of connection metal layers included in at least two of the first to N-th connection wires may be equal to or different from each other.

In a further embodiment, a lighting apparatus may include: a light source module including the light-emitting device; a heat sink for dissipating heat generated from the light source module; and a power supply unit for supplying power to the light source module.

Advantageous Effects

In light-emitting devices according to embodiments, the overall distribution of emitted light is uniform, a problem of current crowding may be solved, light emission efficiency may be improved thanks to an overall enlarged active region, and optical extraction efficiency may be maximized. In addition, the light-emitting devices may be appropriate for use with high voltage, since a larger number of light-emitting cells is disposed in a given planar area of a substrate. Furthermore, even when any one of a plurality of connection metal layers is disconnected, carriers may move between the light-emitting cells via the remaining connection metal layers, whereby the reliability of the light-emitting devices may be improved.

DESCRIPTION OF DRAWINGS

FIG. 1 is a plan view showing a light-emitting device according to an embodiment;

FIG. 2 is a sectional view of the light-emitting device taken along line I-I' of FIG. 1;

FIG. 3 is a sectional view of the light-emitting device taken along line II-II' of FIG. 1;

FIG. 4 is a sectional view of the light-emitting device taken along line III-III' of FIG. 1;

FIG. 5 is a circuit diagram of the light-emitting device shown in FIG. 1;

FIG. 6 is a plan view showing a light-emitting device according to another embodiment;

FIG. 7 is a plan view showing a light-emitting device according to still another embodiment; and FIG. 8 is a plan view showing a light-emitting device according to still another embodiment.

BEST MODE

Reference will now be made in detail to preferred embodiments, examples of which are illustrated in the accompanying drawings. However, the embodiments may be modified into various other forms. The embodiments are not restrictive but are illustrative. The embodiments are provided to more completely explain the disclosure to a person having ordinary skill in the art.

It will be understood that when an element is referred to as being "on" or "under" another element, it can be directly on/under the element, or one or more intervening elements may also be present. In addition, when an element is referred to as being "on" or "under," "under the element" as well as "on the element" may be included based on the element.

In addition, relational terms, such as "first," "second," "on/upper part/above" and "under/lower part/below," are used only to distinguish between one subject or element and another subject and element, without necessarily requiring or involving any physical or logical relationship or sequence between such subjects or elements.

FIG. 1 is a plan view showing a light-emitting device 100A according to an embodiment, FIG. 2 is a sectional view of the light-emitting device 100A taken along line I-I' of FIG. 1, FIG. 3 is a sectional view of the light-emitting device 100A taken along line II-II' of FIG. 1, and FIG. 4 is a sectional view of the light-emitting device 100A taken along line III-III' of FIG. 1.

Referring to FIGS. 1 to 4, the light-emitting device 100A may include a substrate 110, a buffer layer 112, a plurality of light-emitting cells P1 to PM, first and second electrodes 132 and 134, a dielectric layer 140, first and second electrode pads 152 and 154, an intermediate pad 156, and first to N-th connection wires CE1 to CEN. Here, M and N may be positive integers, each of which is equal to or greater than 2, and 1≤N≤M−1.

The buffer layer 112 may be disposed on the substrate 110. The substrate 110 may be formed of a material that is appropriate for growing a semiconductor material, such as a carrier wafer. In addition, the substrate 110 may be formed of a material exhibiting high thermal conductivity. The substrate 110 may be a conductive substrate or a dielectric material. In addition, the substrate 110 may be made of a material being capable of transmitting light. The substrate 110 may have mechanical strength sufficient to be easily divided into individual chips through a scribing process and a breaking process without causing the entirety of an nitride light-emitting structure 120 of the light-emitting device 100A to be bowed. For example, the substrate 110 may be made of at least one material selected from among sapphire ($Al_2O_3$), GaN, SiC, ZnO, Si, GaP, InP, $Ga_2O_3$, GaAs, and Ge. An irregular pattern may be formed on the substrate 110. For example, the substrate 110 may be a patterned sapphire substrate (PSS), although this is not shown.

The buffer layer 112 may be disposed between the substrate 110 and the light-emitting structure 120, and may be made of a Group III-V compound semiconductor. The buffer layer 112 serves to reduce the difference in lattice constant between the substrate 110 and the light-emitting structure 120. For example, the buffer layer 112 may include AlN or an undoped nitride. However, the disclosure is not limited thereto. The buffer layer 112 may be omitted depending the kind of the substrate 110 and the kind of the light-emitting structure 120.

Depending on the circumstances, the buffer layer 112 may be omitted. In the following description, the buffer layer 112 is omitted. However, the following description may equally apply to the case in which the buffer layer 112 is not omitted.

The light-emitting cells P1 to PM may be disposed on the substrate 110. The light-emitting cells P1 to PM will be referred to as a first light-emitting cell P1 to an M-th light-emitting cell PM in sequence. The light-emitting structure 120 constituting one light-emitting cell may be separated from the light-emitting structure 120 constituting another light-emitting cell by a boundary region S. The boundary region S may be a region around each of the first to M-th light-emitting cells P1 to PM, or may be the substrate 110.

In the following description, M=6 and N=5. However, the disclosure is not limited thereto. That is, the following description may equally apply to the case in which M is less than or greater than 6 and the case in which N is less than or greater than 5.

The first to sixth light-emitting cells P1 to P6 may be arranged between the first electrode pad 152 and the second electrode pad 154 in a line in a first direction (e.g. the z-axis direction). The first to M-th light-emitting cells P1 to PM may be spaced apart from each other. However, the disclosure is not limited thereto.

Each of the first to sixth light-emitting cells P1 to P6 may include a first conductive semiconductor layer 122, an active layer 124, and a second conductive semiconductor layer 126, which are sequentially disposed on the substrate 110. That is, the light-emitting structure 120 disposed on the substrate 110 may be divided into M light-emitting cells. The light-emitting structure 120 may include a first conductive semiconductor layer 122, an active layer 124, and a second conductive semiconductor layer 126.

The first conductive semiconductor layer 122 may be disposed between the substrate 110 and the active layer 124, may include a semiconductor compound, may be made of a Group III-V or II-VI compound semiconductor, and may be doped with a first conductive dopant. For example, the first conductive semiconductor layer 122 may include at least one of a semiconductor material having a composition formula of $Al_xIn_yGa_{(1-x-y)}N$ ($0 \leq x \leq 1$, $0 \leq y \leq 1$, $0 \leq x+y \leq 1$), InAlGaN, AlGaAs, GaP, GaAs, GaAsP, or AlGaInP. In the case in which the first conductive semiconductor layer 122 is an n-type semiconductor layer, the first conductive dopant may include an n-type dopant, such as Si, Ge, Sn, Se, or Te. The first conductive semiconductor layer 122 may have a single-layer or multi-layer structure. However, the disclosure is not limited thereto.

The active layer 124 may be disposed between the first conductive semiconductor layer 122 and the second conductive semiconductor layer 126, and may include any one OF a single-well structure, a multi-well structure, a single-quantum-well structure, a multi-quantum-well (MQW) structure, a quantum-dot structure, and a quantum-wire structure. The active layer 124 may be formed to have a pair structure including a well layer and a barrier layer using a Group III-V compound semiconductor materials, for example, at least one of InGaN/GaN, InGaN/InGaN, GaN/AlGaN, InAlGaN/GaN, GaAs(InGaAs)/AlGaAs, or GaP (InGaP)/AlGaP. However, the disclosure is not limited thereto. The well layer may be made of a material having a smaller energy band gap than an energy band gap of the barrier layer.

The second conductive semiconductor layer 126 may be disposed on the active layer 124, and may include a semiconductor compound. The second conductive semiconductor layer 126 may be made of a Group III-V or II-VI compound semiconductor. For example, the second conductive semiconductor layer 126 may include at least one of a semiconductor material having a compositional formula of $In_xAl_yGa_{1-x-y}N$ ($0 \leq x \leq 1$, $0 \leq y \leq 1$, $0 \leq x+y \leq 1$), AlInN, AlGaAs, GaP, GaAs, GaAsP, or AlGaInP.

In the case in which the second conductive semiconductor layer 126 is a p-type semiconductor layer, the second conductive dopant may be a p-type dopant, such as Mg, Zn, Ca, Sr, or Ba. The second conductive semiconductor layer 126 may have a single-layer or multi-layer structure. However, the disclosure is not limited thereto.

The first conductive semiconductor layer 122 may be an n-type semiconductor layer and the second conductive semiconductor layer 126 may be a p-type semiconductor layer. Alternatively, the first conductive semiconductor layer 122 may be a p-type semiconductor layer and the second conductive semiconductor layer 126 may be an n-type semiconductor layer. Consequently, the light-emitting structure 120 may include at least one of an n-p junction structure, a p-n junction structure, an n-p-n junction structure, or a p-n-p junction structure.

Unlike what is shown in FIG. 1, the side surface of the light-emitting structure 120 may be inclined with respect to the substrate 110. The side surface of the light-emitting structure 120 is inclined in order to prevent disconnection of each connection wire that electrically connect adjacent light-emitting cells.

Also, in each light-emitting cell Pm, the first electrode 132 may be disposed on the first conductive semiconductor layer 122. Here, m may be a positive integer satisfying $1 \leq m \leq M$. For example, referring to FIG. 2, in each of the first and second light-emitting cells P1 and P2, the first electrode 132 is disposed on the first conductive semiconductor layer 122. Referring to FIGS. 3 and 4, in each of the second to fourth light-emitting cells P2, P3, and P4, the first electrode 132 is disposed on the first conductive semiconductor layer 122. In order to dispose the first electrode 132 on the first conductive semiconductor layer 122, a portion of the first conductive semiconductor layer 122 of the light-emitting structure 120 may be exposed. That is, the second conductive semiconductor layer 126, the active layer 124, and the first conductive semiconductor layer 122 may be partially etched by mesa etching to expose a portion of the first conductive semiconductor layer 122. At this time, the exposed surface of the first conductive semiconductor layer 122 may be located lower than the lower surface of the active layer 124. Also, in an n-th light-emitting cell, the first electrode 132 may be integrally formed with an n-th connection wire CEn, instead of the first electrode 132 being separately provided on the first conductive semiconductor layer 122. Here, n may be a positive integer satisfying $1 \leq n \leq N$.

In each light-emitting cell Pm, the second electrode 134 may be disposed on the second conductive semiconductor layer 126 so as to be electrically connected to the second conductive semiconductor layer 126. For example, referring to FIG. 2, in each of the first and second light-emitting cells P1 and P2, the second electrode 134 is disposed on the second conductive semiconductor layer 126. In addition, referring to FIGS. 3 and 4, in each of the third to fifth light-emitting cells P3, P4, and P5, the second electrode 134 is disposed on the second conductive semiconductor layer 126. Alternatively, in the (n+1)-th light-emitting cell P(n+1), the second electrode 134 may be integrally formed with the n-th connection wire CEn, instead of the second electrode 134 being separately provided on the second conductive semiconductor layer 126. For example, unlike what is shown in FIG. 2, the second electrode 134 of the second light-emitting cell P2 may be integrally formed with the first connection wire CE1 (e.g. a 1-2 connection metal layer CE12).

In addition, each of the first and second electrodes 132 and 134 of each light-emitting cell Pm may have a structure in which an adhesive layer (not shown), a barrier layer (not shown), a reflective layer (not shown), and a bonding layer (not shown) are sequentially stacked.

The adhesive layer of the first electrode 132 may include a material that ohmically contacts the first conductive semiconductor layer 122, and the adhesive layer of the second electrode 134 may include a material that ohmically contacts the second conductive semiconductor layer 126. For example, the adhesive layer may be formed so as to have a single-layer or multi-layer structure made of at least one material selected from among Cr, Rd, and Ti.

The barrier layer may be disposed on the adhesive layer, and may be formed so as to have a single-layer or multi-layer structure made of at least one material selected from among Ni, Cr, Ti, and Pt. For example, the barrier layer may be made of an alloy of Cr and Pt.

In addition, the reflective layer, made of Ag, may be interposed between the barrier layer and the adhesive layer. Alternatively, the reflective layer may be omitted.

In addition, the bonding layer may be disposed on the reflective layer, any may include Au.

In addition, the length of each of the first to M-th light-emitting cells P1 to PM in the first direction (e.g. the z-axis direction) may gradually decrease as approaching a center line CL crossing between the first light-emitting cell P1 and the M-th light-emitting cell PM, and may gradually increase as being far away from the center line CL. For example, the lengths L1, L2, and L3 of the first to third light-emitting cells P1 to P3 in the first direction may gradually decrease as approaching the center line CL. In addition, the lengths L4, L5, and L6 of the fourth to sixth light-emitting cells P4 to P6 in the first direction may gradually increase as being far away from the center line CL.

The width of each of the first to sixth light-emitting cells P1 to P6 in a second direction gradually increases as approaching the center line CL. In the case in which the lengths L1 to L6 of the first to sixth light-emitting cells P1 to P6 in the first direction are gradually decreased as approaching the center line CL and gradually increased as being far away from the center line CL, therefore, the planar area (e.g. the area on the y axis and the z axis) of the active region of each of the first to sixth light-emitting cells P1 to P6 may be made uniform. Here, referring to FIG. 1, the active region may be a region excluding the boundary region S and the first conductive semiconductor layer 122 exposed by mesa etching. Referring to FIG. 2, the active region may mean the width AA of the active layer 124.

Also, in the case in which the planar area of the active region of each of the first to sixth light-emitting cells P1 to P6 is in an error (i.e. the area deviation of the active region) range of within 20%, e.g. about 2% or 3%, of the average area, the planar area of each of the first to sixth light-emitting cells P1 to P6 may be uniform. However, the disclosure is not limited thereto. Here, the average area may mean a value obtained by dividing the sum of the active regions of the first to sixth light-emitting cells P1 to P6 by the number of light-emitting cells. To this end, the lengths L1 to L6 of the first to sixth light-emitting cells P1 to P6 in the z-axis direction may be determined in consideration of the width of the light-emitting device 100A in the y-axis direction.

In the case in which the area deviation of the active region is in a range of within 20%, e.g. 2% or 3%, even though the planar areas of the active regions of the first to sixth light-emitting cells P1 to P6 are different from each other, as described above, carriers may not be excessively spread toward any one of the first to sixth light-emitting cells P1 to P6, with the result the carriers may be uniformly spread overall. In addition, current density may be made uniform, whereby the likelihood of device breakdown may be reduced. Consequently, reliability may be improved, and optical extraction efficiency may be improved.

In addition, at least one of the planar sizes or the planar shapes of the active regions of the first to M-th light-emitting cells P1 to PM may be symmetric with respect to the center line CL. For example, at least one of the planar sizes or the planar shapes of the first light-emitting cell P1 and the sixth light-emitting cell P6 may be symmetric with respect to the center line CL. At least one of the planar sizes or the planar shapes of the second light-emitting cell P2 and the fifth light-emitting cell P5 may be symmetric with respect to the center line CL. At least one of the planar sizes or the planar shapes of the third light-emitting cell P3 and the fourth light-emitting cell P4 may be symmetric with respect to the center line CL.

In the case in which at least one of the planar sizes or the planar shapes of the active regions of the first to M-th light-emitting cells P1 to PM is symmetric with respect to the center line CL, as described above, the overall distribution of light emitted by the light-emitting device 100A may be made uniform.

Meanwhile, the first to N-th connection wires CE1 to CEN serve to electrically connect the first to M-th light-emitting cells P1 to PM. That is, the first to N-th connection wires may connect the first to M-th light-emitting cells P1 to PM in series from a start point of the first light-emitting cell P1, at which the first electrode pad 152 is located, to an end point of the M-th light-emitting cell PM, at which the second electrode pad 154 is located.

An n-th connection wire CEn, which represents each of the first to N-th connection wires CE1 to CEN, may be disposed on an n-th light-emitting cell Pn, an (n+1)-th light-emitting cell P(n+1), and a boundary region S between the n-th light-emitting cell Pn and the (n+1)-th light-emitting cell P(n+1) to electrically connect the first conductive semiconductor layer 122 of the n-th light-emitting cell Pn and the second conductive semiconductor layer 126 of the (n+1)-th light-emitting cell P(n+1), which are adjacent to each other.

For example, the first connection wire CE1 may electrically connect the first conductive semiconductor layer 122 of the first light-emitting cell P1 to the second conductive semiconductor layer 126 of the second light-emitting cell P2. The second connection wire CE2 may electrically connect the first conductive semiconductor layer 122 of the second light-emitting cell P2 to the second conductive semiconductor layer 126 of the third light-emitting cell P3. The third connection wire CE3 may electrically connect the first conductive semiconductor layer 122 of the third light-emitting cell P3 to the second conductive semiconductor layer 126 of the fourth light-emitting cell P4. The fourth connection wire CE4 may electrically connect the first conductive semiconductor layer 122 of the fourth light-emitting cell P4 to the second conductive semiconductor layer 126 of the fifth light-emitting cell P5. The fifth connection wire CE5 may electrically connect the first conductive semiconductor layer 122 of the fifth light-emitting cell P5 to the second conductive semiconductor layer 126 of the sixth light-emitting cell P6.

In addition, the n-th connection wire CEn may include a plurality of connection metal layers CEn1 to CEnQ. A plurality of n1-th to nQ-th connection metal layers CEn1 to CEnQ may be disposed so as to be electrically isolated from each other in a second direction (e.g. the y-axis direction), which is different from the first direction (e.g. the z-axis direction). Here, Q may be a positive integer that is equal to or greater than 2.

For example, the first connection wire CE1 may include (1-1)th to (1-3)th connection metal layers CE11 to CE13, the second connection wire CE2 may include (2-1)th to (2-4)th connection metal layers CE21 to CE24, the third connection wire CE3 may include (3-1)th to (3-5)th connection metal layers CE31 to CE35, the fourth connection wire CE4 may include (4-1)th to (4-4)th connection metal layers CE41 to CE44, and the fifth connection wire CE5 may include (5-1)th to (5-3)th connection metal layers CE51 to CE53.

Each of the connection metal layers CEn1 to CEnQ included in each (i.e. CEn) of the aforementioned first to N-th connection wires CE1 to CEN may be made of a material that is identical to or different from that of each of the first and second electrodes 132 and 134. In the case in which each of the connection metal layers CEn1 to CEnQ is made of a material that is identical to that of each of the first and second electrodes 132 and 134, the connection metal layers CEn1 to CEnQ may be integrally formed with at least one of the first or second electrode 132 or 134, as previously described. Each of the connection metal layers CEn1 to CEnQ may include at least one of Cr, Rd, Au, Ni, Ti, or Pt. However, the disclosure is not limited thereto.

Also, in the light-emitting device 100A shown in FIG. 1, each of the n1-th to nQ-th connection metal layers CEn1 to CEnQ included in each connection wire CEn is shown as having a quadrangular planar shape. However, the disclosure is not limited thereto. That is, each of the n1-th to nQ-th connection metal layers CEn1 to CEnQ may have various planar shape.

In addition, a plurality of connection metal layers included in one of the first to N-th connection wires CE1 to CEN and a plurality of connection metal layers included in another of the first to N-th connection wires CE1 to CEN may be disposed so as to be staggered from each other in the first direction (e.g. the z-axis direction).

For example, a plurality of connection metal layers CEk1 to CEkQ included in a k-th connection wire CEk and a plurality of connection metal layers CE(k+1)1 to CE(k+1)Q included in a (k+1)-th connection wire CE(k+1) may be disposed so as to be staggered from each other in the first direction. Here, 1≤k≤N−1.

In the case in which N=5, the (1-1)th to (1-3)th connection metal layers CE11 to CE13 included in the first connection wire CE1 and the (2-1)th to (2-4)th connection metal layers CE21 to CE24 included in the second connection wire CE2 may be disposed so as to be staggered from each other in the first direction. The (2-1)th to (2-4)th connection metal layers CE21 to CE24 included in the second connection wire CE2 and the (3-1)th to (3-5)th connection metal layers CE31 to CE35 included in the third connection wire CE3 may be disposed so as to be staggered from each other in the first direction. The (3-1)th to (3-5)th connection metal layers CE31 to CE35 included in the third connection wire CE3 and the (4-1)th to (4-4)th connection metal layers CE41 to CE44 included in the fourth connection wire CE4 may be disposed so as to be staggered from each other in the first direction. The (4-1)th to (4-4)th connection metal layers CE41 to CE44 included in the fourth connection wire CE4 and the (5-1)th to (5-3)th connection metal layers CE51 to CE53 included in the fifth connection wire CE5 may be disposed so as to be staggered from each other in the first direction.

In the case in which adjacent connection metal layers are disposed so as to be staggered from each other in the first direction, as described above, carriers are uniformly spread in the first direction, thereby solving the problem in which current flowing in the first direction CP marked by an arrow becomes crowded.

In addition, the numbers of connection metal layers included in at least two of the first to N-th connection wires CE1 to CEN may be equal to each other, or may be different from each other. That is, Q of the first to N-th connection wires CE1 to CEN may be the same or different. The numbers Q of connection metal layers included in at least two of the first, second, third, fourth, or fifth connection wires CE1, CE2, CE3, CE4, or CE5 may be equal to each other, or may be different from each other.

For example, as shown in FIG. 1, the numbers of connection metal layers included in the first and fifth connection wires CE1 and CE5 may be equally 3 (Q=3). The numbers of connection metal layers included in the second and fourth connection wires CE2 and CE4 may be equally 4 (Q=4). The number of connection metal layers included in the third connection wire CE3 may be equally 5 (Q=5). The numbers of connection metal layers included in the first, second, and third connection wires CE1, CE2, and CE3 may be different from each other.

In addition, the number of connection metal layers included in each of the first to N-th connection wires CE1 to CEN may gradually increase as approaching the center line CL crossing between the first light-emitting cell P1 and the M-th light-emitting cell PM. For example, the number of connection metal layers included in each of the first and fifth connection wires CE1 and CE5, which are the farthest from the center line CL, may be 3, which may be the smallest. In addition, the number of connection metal layers included in each of the second and fourth connection wires CE2 and CE4, which are closer to the center line CL than the first and fifth connection wires CE1 and CE5, may be 4, which is greater than 3 by 1. In addition, the number of connection metal layers included in the third connection wire CE3, which is closer to the center line CL than the second and fourth connection wires CE2 and CE4, may be 5, which is greater than 4 by 1. As described above, the numbers of connection metal layers included in the first to third connection wires CE1, CE2, and CE3 may gradually increase as approaching the center line CL, and the numbers of connection metal layers included in the fifth, fourth, and third connection wires CE5, CE4, and CE3 may gradually increase as approaching the center line CL.

As shown in FIG. 1, the width of the light-emitting cells may gradually increase as approaching the center line CL. It is necessary for carriers to be uniformly spread as a width of a light-emitting cell gets bigger. In the case in which the number of connection metal layers gradually increases as approaching the center line CL, as described above, the carriers may be uniformly spread from a light-emitting cell having a great width.

In addition, the numbers of connection metal layers included in the first to N-th connection wires CE1 to CEN may be symmetric with respect to the center line CL. For example, the number of connection metal layers CE11, CE12, and CE13 included in the first connection wire CE1 and the number of connection metal layers CE51, CE52, and CE53 included in the fifth connection wire CE5 may be 3, i.e. symmetric with respect to the center line CL. The number of connection metal layers CE21, CE22, CE23, and CE24 included in the second connection wire CE2 and the number of connection metal layers CE41, CE42, CE43, and CE44 included in the fourth connection wire CE4 may be 4, i.e. symmetric with respect to the center line CL.

In the case in which the numbers of connection metal layers are symmetric with respect to the center line CL, as described above, light emitted from the active layer 124 may be uniformly distributed.

In addition, the distance between the connection metal layers of each of the first to N-th connection wires CE1 to CEN may gradually decrease as approaching the edge of the light-emitting device 100A in the second direction (e.g. the y-axis direction).

For example, the (2-1)th and (2-2)th connection metal layers CE21 and CE22 are disposed so as to be closer to the edge of the light-emitting device 100A in the second direction than the (2-2)th and (2-3)th connection metal layers CE22 and CE23. In this case, a first distance d1 between the (2-1)th and (2-2)th connection metal layers CE21 and CE22 may be less than a second distance d2 between the (2-2)th and (2-3)th connection metal layers CE22 and CE23.

The (4-1)th and (4-2)th connection metal layers CE41 and CE42 are disposed so as to be closer to the edge of the light-emitting device 100A in the second direction than the (4-2)th and (4-3)th connection metal layers CE42 and CE43. In this case, a third distance d3 between the (4-1)th and (4-2)th connection metal layers CE41 and CE42 may be less than a fourth distance d4 between the (4-2)th and (4-3)th connection metal layers CE42 and CE43.

The (3-1)th and (3-2)th connection metal layers CE31 and CE32 are disposed so as to be closer to the edge of the light-emitting device 100A in the second direction than the (3-2)th and (3-3)th connection metal layers CE32 and CE33. In this case, a fifth distance d5 between the (3-1)th and (3-2)th connection metal layers CE31 and CE32 may be less than a sixth distance d6 between the (3-2)th and (3-3)th connection metal layers CE32 and CE33.

In addition, the distance between the connection metal layers of each of the first to N-th connection wires CE1 to CEN may gradually increase as approaching the center line CL.

For example, the third connection wire CE3 is closer to the center line CL than the second connection wire CE2. Consequently, the fifth distance d5 between the (3-1)th and (3-2)th connection metal layers CE31 and CE32 included in the third connection wire CE3 may be greater than the first distance d1 between the (2-1)th and (2-2)th connection metal layers CE21 and CE22 included in the second connection wire CE2.

In addition, the third connection wire CE3 is closer to the center line CL than the fourth connection wire CE4. Consequently, the fifth distance d5 between the (3-1)th and (3-2)th connection metal layers CE31 and CE32 included in the third connection wire CE3 may be greater than the third distance d3 between the (4-1)th and (4-2)th connection metal layers CE41 and CE42 included in the fourth connection wire CE4.

Generally, carriers may be more crowded in the center of the light-emitting device 100A than at the edge of the light-emitting device 100A in the first direction (e.g. the z-axis direction), or in the center of the light-emitting device 100A than at the edge of the light-emitting device 100A in the second direction (e.g. the y-axis direction).

Considering that, in the case in which the distance between the connection metal layers is gradually increased as approaching the center of the light-emitting device 100A according to the embodiment in the second direction, as described above, the carriers crowding to the center of the light-emitting device in the second direction may be distributed to the edge of the light-emitting device in the second direction, thereby achieving uniform spreading of the carrier. Also, in the case in which the distance between the connection metal layers is gradually increased as approaching the center of the light-emitting device 100A from the edge of the light-emitting device 100A in the first direction, the carriers crowding to the center of the light-emitting device in the first direction may be distributed to the edge of the light-emitting device in the first direction, thereby achieving uniform spreading of the carriers. In the case in which the carriers are uniformly spread, therefore, it is possible to prevent the occurrence of a phenomenon in which current is crowded toward the center of the light-emitting device 100A.

Meanwhile, the first electrode pad 152 may be electrically connected to the second conductive semiconductor layer 126 of the first light-emitting cell P1, and the second electrode pad 154 may be connected to the first conductive semiconductor layer 122 of the sixth light-emitting cell P6.

In addition, the first electrode pad 152 and the second electrode pad 154 may be disposed so as to be opposite each other in the first direction.

In addition, each of the first and second electrode pads 152 and 154 may be disposed at a corner of the light-emitting device 100A. Consequently, the ratio of the area occupied by the first and second electrode pads 152 and 154 to the entire area of the light-emitting device 100A is smaller than in the conventional art. Consequently, the active region of the light-emitting device 100A may be overall increased, whereby light emission efficiency may be improved.

A wire (not shown) for providing first power may be bonded to the first electrode pad 152. Referring to FIG. 2, the first electrode pad 152 may be disposed on the second conductive semiconductor layer 126 of one (e.g. P1) of the first to M-th light-emitting cells P1 to PM so as to be electrically connected to the second conductive semiconductor layer 126.

In addition, a wire (not shown) for providing second power may be bonded to the second electrode pad 154. Referring to FIG. 1, the second electrode pad 154 may be disposed on the first conductive semiconductor layer 122 of another (e.g. P=6) of the first to M-th light-emitting cells P1 to PM so as to be electrically contacted to the first conductive semiconductor layer 122.

In addition, a conductive layer (not shown) may be further disposed between the second electrode 134 and the second conductive semiconductor layer 126. Since the conductive layer reduces total reflection and exhibits high light-transmittance, the extraction efficiency of the light emitted from the active layer 124 and transmitted through the second conductive semiconductor layer 126 may be improved. The conductive layer may be formed so as to have a single-layer or multi-layer structure by using transparent oxide materials exhibiting high transmittance for visible wavelengths, for example, at least one of ITO (Indium Tin Oxide), TO (Tin Oxide), IZO (Indium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), AZO (Aluminum Zinc Oxide), ATO (Aluminum Tin Oxide), GZO (Gallium Zinc Oxide), IrOx, RuOx, RuOx/ITO, Ni, Ag, Ni/IrOx/Au, or Ni/IrOx/Au/ITO. Depending on the circumstances, as shown in FIGS. 2 to 4, the conductive layer may be omitted. The area of the conductive layer disposed on the second conductive semiconductor layer 126 may be equal to or less than the upper area of the second conductive semiconductor layer 126.

In addition, the light-emitting device 100A may further include at least one intermediate pad. The intermediate pad may be electrically connected to the first conductive semiconductor layer 122 or the second conductive semiconductor layer 126 of an arbitrary light-emitting cell disposed between the first light-emitting cell P1 and the M-th light-emitting cell PM. For example, the intermediate pad may be disposed on the dielectric layer 140 of an arbitrary one of the remaining light-emitting cells (e.g. P2 to P5), excluding the light-emitting cells (e.g. P1 and P6) on which the first electrode pad 152 and the second electrode pad 154 are located, respectively.

For example, as shown in FIGS. 1 and 4, the intermediate pad 156 may be disposed on the second electrode 134 of the fourth light-emitting cell P4 so as to be electrically connected to the second conductive semiconductor layer 126. In the case in which the intermediate pad 156 is connected to the second conductive semiconductor layer 126, as shown in FIG. 1, a wire (not shown) for providing first power may be bonded to the intermediate pad 156. Alternatively, in the case in which the intermediate pad 156 is connected to the first conductive semiconductor layer 122, unlike what is shown in FIG. 1, a wire (not shown) for providing second power may be bonded to the intermediate pad 156.

As shown in FIG. 4, the second electrode layer 134 may be located between the intermediate pad 156 and the second conductive semiconductor layer 126, and the intermediate pad 156 may be electrically connected to any one of the connection metal layers located in the same light-emitting cell. For example, the intermediate pad 156 located on the second electrode layer 134 of the fourth light-emitting cell P4 may be electrically connected to one end of any one of the (3-1)th to (3-5)th connection metal layers CE31 to CE35, e.g. the (3-1)th connection metal layer CE31.

In another embodiment, however, the intermediate pad 156 may not be directly electrically connected to the connection metal layers located in the same light-emitting cell. That is, unlike what is shown in FIG. 4, the intermediate pad 156 may not be directly connected to the (3-1)th connection metal layer CE31, but may be disposed so as to be separate from the (3-1)th connection metal layer CE31.

In addition, the substrate 110 may have any of various polygonal planar shapes. For example, as shown in FIG. 1, the substrate 110 may have a quadrangular planar shape. Although not shown, the substrate 110 may have any of various polygonal planar shapes, such as a pentagonal planar shape, a hexagonal planar shape, an octagonal planar shape, a diamond planar shape, or a trapezoidal planar shape. In the case in which the substrate 110 has a polygonal planar shape, the first direction may be a diagonal direction of the polygon.

Meanwhile, the dielectric layer 140 may be disposed between the first to N-th connection wires and adjacent light-emitting cells connected to each other via the respective connection wires to electrically isolate the connection wires from the light-emitting cells. That is, the dielectric layer 140 may be disposed between the (n-1)th to (n-Q)th connection metal layers CEn1 to CEnQ of the n-th connection wire CEn and adjacent n-th and (n+1)-th light-emitting cells Pn and P(n+1) connected to each other via the connection wires to electrically isolate the (n-1)th to (n-Q)th connection metal layers CEn1 to CEnQ of the n-th connection wire CEn from the n-th light-emitting cell Pn and to electrically isolate the (n-1)th to (n-Q)th connection metal layers CEn1 to CEnQ of the n-th connection wire CEn from the (n+1)-th light-emitting cell P(n+1). For example, referring to FIG. 2, the dielectric layer 140 may be disposed between the (1-2)th connection metal layer CE12 of the first connection wire CE1 and adjacent first and second light-emitting cells P1 and P2 to electrically isolate the (1-2)th connection metal layer CE12 of the first connection wire CE1 from the first and second light-emitting cells P1 and P2. However, the disclosure is not limited thereto. That is, in another embodiment, the dielectric layer 140 may be further disposed on the light-emitting cells and the boundary region S. That is, the dielectric layer 140 may cover the upper surfaces and the side surfaces of the light-emitting cells and may cover the boundary region S. For example, referring to FIG. 2, the dielectric layer 140 may cover the upper surfaces and the side surfaces of the first and second light-emitting cells P1 and P2, and may cover the boundary region S. The dielectric layer 140 may be made of a light-transmitting dielectric material, such as $SiO_2$, $SiO_x$, $SiO_xN_y$, $Si_3N_4$, or $Al_2O_3$. However, the disclosure is not limited thereto.

FIG. 5 is a circuit diagram of the light-emitting device 100A shown in FIG. 1.

Referring to FIG. 5, the light-emitting device 100A may have two positive (+) terminals, such as a first electrode pad 152 and an intermediate pad 156, and a common negative (−) terminal, such as a second electrode pad 154. The first electrode pad 152 may be electrically connected to the second conductive semiconductor layer 126 of the first light-emitting cell P1, and the second electrode pad 154 may be electrically connected to the first conductive semiconductor layer 122 of the M-th light-emitting cell (e.g. the sixth light-emitting cell P6 in FIG. 1).

Since the light-emitting device 100A according to the embodiment has the first electrode pad 152 and the intermediate pad 156, which are the positive (+) terminals, as described above, various driving voltages may be used, and the brightness of the light-emitting device may be adjusted variously.

As described above, the embodiment may be designed such that first power is supplied to any one of the intermediate pad 156 and the first electrode pad 152 depending on the driving voltage that is applied in order to drive some or all of the light-emitting cells.

FIG. 6 is a plan view showing a light-emitting device 100B according to another embodiment.

According to an embodiment, in the light-emitting device 100A shown in FIG. 1, opposing surfaces of adjacent ones of the first to M-th light-emitting cells P1 to PM may be flat in a plan view. For example, referring to FIG. 1, opposing surfaces S1 and S2 of the first and second light-emitting cells P1 and P2, which are adjacent to each other, are flat in a plan view.

According to another embodiment, opposing surfaces of adjacent ones of the first to M-th light-emitting cells P1 to PM may be curved in a plane view. For example, referring to FIG. 6, opposing surfaces S1 and S2 of the first and second light-emitting cells P1 and P2, which are adjacent to each other, are curved in a plan view.

In addition, at least one of the planar shape or the planar size of the active region of the light-emitting device 100A shown in FIG. 1 may be symmetric with respect to the center line CL, whereas the planar shape and the planar size of the active region of the light-emitting device 100B shown in FIG. 6 may be asymmetric with respect to the center line CL.

Except for the above difference, the light-emitting device 100B shown in FIG. 6 is identical to the light-emitting device 100A shown in FIG. 1, and therefore a duplicate description thereof will be omitted.

FIG. 7 is a plan view showing a light-emitting device 100C according to still another embodiment.

In the light-emitting device 100A shown in FIG. 1, the opposing surfaces of adjacent light-emitting cells are flat in a plan view. In the light-emitting device 100B shown in FIG. 6, the opposing surfaces of adjacent light-emitting cells are curved in a plane view. In contrast, in the light-emitting device 100C shown in FIG. 7, the opposing surfaces of adjacent light-emitting cells may be flat and curved in a plane view.

For example, referring to FIG. 7, the opposing surfaces of the first and second light-emitting cells P1 and P2, which are adjacent to each other, and the opposing surfaces of the fifth and sixth light-emitting cells P5 and P6, which are adjacent to each other, are curved in a plane view. In contrast, the opposing surfaces of the second and third light-emitting cells P2 and P3, which are adjacent to each other, the opposing surfaces of the third and fourth light-emitting cells P3 and P4, which are adjacent to each other, the opposing surfaces of the fourth and fifth light-emitting cells P4 and P5, which are adjacent to each other, and the opposing surfaces of the sixth and seventh light-emitting cells P6 and P7, which are adjacent to each other, may be flat in a plane view.

Except for the above differences, the light-emitting device 100C shown in FIG. 7 is identical to the light-emitting device 100A shown in FIG. 1, and therefore a duplicate description thereof will be omitted.

In the case in which the opposing surfaces of the adjacent light-emitting cells are curved in a plane view, as described above, optical extraction efficiency may be maximized.

FIG. 8 is a plan view showing a light-emitting device 100D according to still another embodiment.

In the case in which the first to M-th light-emitting cells P1 to PM are arranged in a first direction in a line between the first electrode pad 152 and the second electrode pad 154, as described above, a larger number of light-emitting cells P1 to PM may be disposed in the given planar area of the substrate 110 than in the case in which the first to M-th light-emitting cells P1 to PM are arranged in a zigzag fashion between the first and second electrode pads 152 and 154. Consequently, the light-emitting device 100D according to the embodiment may be used for high-voltage applications.

In FIG. 8, the light-emitting device 100D is shown as including twenty (M=20) light-emitting cells P1 to P20. However, the disclosure is not limited thereto. That is, the light-emitting device 100D may include more than 20 light-emitting cells. With the exception that M=6 in FIG. 1 while M=20 in FIG. 8, the light-emitting device 100D shown in FIG. 8 is identical to the light-emitting device 100A shown in FIG. 1, and therefore a duplicate description thereof will be omitted.

As described above, in the light-emitting devices 100A to 100D according to the embodiments, adjacent light-emitting cells are connected to each other via a plurality of connection metal layers. Even when any one of the connection metal layers is disconnected, therefore, the carriers may move between the light-emitting cells via the remaining connection metal layers, whereby the reliability of the light-emitting devices 100A to 100D may be improved.

A plurality of light-emitting device packages, each of which includes light-emitting devices according to embodiments, may be arrayed on a board, and optical members, such as a light guide plate, a prism sheet, and a diffusion sheet, may be disposed in the path of the light emitted from the light-emitting device packages. The light-emitting device packages, the board, and the optical members may function as a backlight unit.

In addition, light-emitting device packages according to embodiments may be included in a display apparatus, an indication apparatus, or a lighting apparatus.

The display apparatus may include a bottom cover, a reflection plate disposed on the bottom cover, a light-emitting module for emitting light, a light guide plate disposed in front of the reflection plate for guiding the light emitted by the light-emitting module forward, an optical sheet including prism sheets disposed in front of the light guide plate, a display panel disposed in front of the optical sheet, an image signal output circuit connected to the display panel for providing an image signal to the display panel, and a color filter disposed in front of the display panel. The bottom cover, the reflection plate, the light-emitting module, the light guide plate, and the optical sheet may constitute a backlight unit.

The lighting apparatus may include a light source module including a board and light-emitting device packages according to embodiments, a heat sink for dissipating the heat generated from the light source module, and a power supply unit for processing or converting an electrical signal received from the outside and supplying the processed or converted signal to the light source module. For example, a lighting apparatus may include a lamp, a headlamp, or a streetlight.

The headlamp may include a light-emitting module including a plurality of light-emitting device packages disposed on a board, a reflector for reflecting the light emitted by the light-emitting module in a predetermined direction, e.g. forward, a lens for refracting forward the light reflected by the reflector, and a shade for blocking or reflecting a portion of the light reflected by the reflector and directed to the lens to achieve a light distribution pattern desired by a designer.

Although embodiments have been described with reference to a number of illustrative embodiments thereof, it should be understood that the embodiments are illustrative and not restrictive and that numerous other modifications and applications may be devised by those skilled in the art that will fall within the intrinsic aspects of the embodiments. For example, various variations and modifications are possible in concrete constituent elements of the embodiments. In addition, it is to be understood that differences relevant to the variations and modifications fall within the spirit and scope of the present disclosure defined in the appended claims.

MODE FOR INVENTION

Various embodiments have been described in the best mode for carrying out the invention.

INDUSTRIAL APPLICABILITY

Light-emitting devices according to embodiments may be used for high voltage, since optical extraction efficiency is maximized and a larger number of light-emitting cells is provided in a given planar area of a substrate.

The invention claimed is:
1. A light-emitting device, comprising:
a substrate;
first and second electrode pads;
first to M-th light-emitting cells disposed on the substrate and arranged in a line in a first direction between the first and second electrode pads (M being a positive integer that is equal to or greater than 2); and first to N-th connection wires for electrically connecting the first to M-th light-emitting cells (N being a positive integer satisfying 1≤N≤M−1), wherein each of the first to M-th light-emitting cells comprises a first conductive semiconductor layer, an active layer, and a second conductive semiconductor layer, which are sequentially disposed on the substrate, wherein the first electrode pad is connected to the second conductive semiconductor layer of the first light-emitting cell while the second electrode pad is connected to the first conductive semiconductor layer of the M-th light-emitting cell, wherein an n-th (n being a positive integer satisfying 1≤n≤N) connection wire electrically connects the first conductive semiconductor layer of an n-th light-emitting cell to the second conductive semiconductor layer of an (n+1)-th light-emitting cell, which are adjacent to each other, wherein the n-th connection wire comprises a plurality of connection metal layers disposed so as to be isolated from each other in a second direction, which is different from the first direction, wherein the connection metal layers included in one selected from among the first to N-th connection wires and the connection metal layers of another selected from among the first to N-th connection wires are disposed so as to be staggered from each other in the first direction, and wherein a number of connection metal layers included in each of the first to N-th connection wires gradually increases as approaching a center line crossing between the first light-emitting cell and the M-th light-emitting cell.

2. The light-emitting device according to claim 1, further comprising an intermediate pad connected to the first light-emitting cell and to the first or second conductive semiconductor layer of an arbitrary light-emitting cell disposed between the first light-emitting cell and the M-th light-emitting cell.

3. The light-emitting device according to claim 1, wherein the connection metal layers included in a k-th (k being a positive integer satisfying 1≤k≤N−1) connection wire and the connection metal layers of a (k+1)-th connection wire are disposed so as to be staggered from each other in the first direction.

4. The light-emitting device according to claim 1, wherein a distance between the connection metal layers of each of the first to N-th connection wires gradually decreases as approaching an edge of the light-emitting device.

5. The light-emitting device according to claim 1, wherein a distance between the connection metal layers in each of the first to N-th connection wires gradually increases as approaching a center line crossing between the first light-emitting cell and the M-th light-emitting cell.

6. The light-emitting device according to claim 1, wherein a length of each of the first to M-th light-emitting cells in the first direction gradually decreases as approaching a center line crossing between the first light-emitting cell and the M-th light-emitting cell and gradually increases as being far away from the center line.

7. The light-emitting device according to claim 1, wherein a planar area deviation of active regions of the first light-emitting cell and the M-th light-emitting cell is within 20%.

8. The light-emitting device according to claim 1, wherein planar shapes of active regions of the first to M-th light-emitting cells are symmetric with respect to a center line crossing between the first light-emitting cell and the M-th light-emitting cell.

9. A lighting apparatus comprising:
a light source module comprising the light-emitting device according to claim 1;
a heat sink for dissipating heat generated from the light source module; and
a power supply unit for supplying power to the light source module.

10. A light-emitting device, comprising:
a substrate;
first and second electrode pads;
first to M-th (M being a positive integer that is equal to or greater than 2) light-emitting cells disposed on the substrate and arranged in a line in a first direction between the first and second electrode pads; and
first to N-th (N being a positive integer satisfying 1≤N≤M−1) connection wires for electrically connecting the first to M-th light-emitting cells,
wherein adjacent ones of the first to M-th light-emitting cells are disposed so as to be spaced apart from each other by a boundary region formed on the substrate,
wherein opposing surfaces of adjacent ones of the first to M-th light-emitting cells are curved in a plane view,
wherein each of the connection wires comprises a plurality of connection metal layers disposed so as to be isolated from each other in a second direction, which is different from the first direction, and
wherein a number of connection metal layers included in the connection wires gradually increases as approaching a center line crossing between the first light-emitting cell and the M-th light-emitting cell.

11. The light-emitting device according to claim 10, wherein planar shapes of active regions of the first to M-th light-emitting cells are asymmetric with respect to a center line crossing between the first light-emitting cell and the M-th light-emitting cell.

12. The light-emitting device according to claim 10, wherein numbers of connection metal layers included in the first to N-th connection wires are symmetric with respect to a center line crossing between the first light-emitting cell and the M-th light-emitting cell.

13. The light-emitting device according to claim 10, wherein the first electrode pad and the second electrode pad are disposed so as to be opposite each other in the first direction.

14. The light-emitting device according to claim 10, wherein the substrate has a polygonal planar shape, and the first direction is a diagonal direction of the polygon.

15. The light-emitting device according to claim 10, wherein numbers of connection metal layers included in at least two of the first to N-th connection wires are equal to each other.

16. The light-emitting device according to claim 10, wherein numbers of connection metal layers included in at least two of the first to N-th connection wires are different from each other.

17. The light-emitting device according to claim 10, wherein a distance between the connection metal layers of each of the first to N-th connection wires is gradually decrease as approaching an edge of the light-emitting device.

18. The light-emitting device according to claim 10, wherein a distance between the connection metal layers in each of the first to N-th connection wires is gradually increase as approaching a center line crossing between the first light-emitting cell and the M-th light-emitting cell.

19. A light-emitting device, comprising:
a substrate;
first and second electrode pads;
first to M-th light-emitting cells disposed on the substrate and arranged in a line in a first direction between the first and second electrode pads (M being a positive integer that is equal to or greater than 2); and
first to N-th connection wires for electrically connecting the first to M-th light-emitting cells (N being a positive integer satisfying 1≤N≤M−1),
wherein each of the first to M-th light-emitting cells comprises a first conductive semiconductor layer, an active layer, and a second conductive semiconductor layer, which are sequentially disposed on the substrate,
wherein the first electrode pad is connected to the second conductive semiconductor layer of the first light-emitting cell while the second electrode pad is connected to the first conductive semiconductor layer of the M-th light-emitting cell,
wherein an n-th (n being a positive integer satisfying 1≤n≤N) connection wire electrically connects the first conductive semiconductor layer of an n-th light-emitting cell to the second conductive semiconductor layer of an (n+1)-th light-emitting cell, which are adjacent to each other,
wherein the n-th connection wire comprises a plurality of connection metal layers disposed so as to be isolated from each other in a second direction, which is different from the first direction, the first conductive semiconductor layer of the n-th light-emitting cell being electrically and directly connected to the second conductive semiconductor layer of the (n+1)-th light-emitting cell by each of the connection metal layers, and
wherein the connection metal layers included in one selected from among the first to N-th connection wires and the connection metal layers of another selected from among the first to N-th connection wires are disposed so as to be staggered from each other in the first direction.

* * * * *